(12) United States Patent
Piffard et al.

(10) Patent No.: US 10,359,477 B2
(45) Date of Patent: Jul. 23, 2019

(54) METHOD AND DEVICE FOR OBSERVING A STATE OF A FUEL-CELL ELECTROCHEMICAL SYSTEM

(71) Applicant: Commissariat a l'energie atomique et aux energies alternatives, Paris (FR)

(72) Inventors: Maxime Piffard, Grenoble (FR); Eric Bideaux, Trevoux (FR); Mathias Gerard, Grenoble (FR); Paolo Massioni, Villeurbanne (FR); Ramon Naiff Da Fonseca, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/862,838

(22) Filed: Jan. 5, 2018

(65) Prior Publication Data

US 2018/0196108 A1     Jul. 12, 2018

(30) Foreign Application Priority Data

Jan. 9, 2017   (FR) .................................... 17 50165

(51) Int. Cl.
| | |
|---|---|
| *G01R 31/387* | (2019.01) |
| *H01M 8/04858* | (2016.01) |
| *H01M 8/04746* | (2016.01) |
| *H01M 8/04701* | (2016.01) |
| *H01M 8/04223* | (2016.01) |

(Continued)

(52) U.S. Cl.
CPC ......... *G01R 31/387* (2019.01); *G01R 31/367* (2019.01); *G01R 31/3842* (2019.01); *H01M 8/0432* (2013.01); *H01M 8/04231* (2013.01); *H01M 8/04305* (2013.01); *H01M 8/04388* (2013.01); *H01M 8/04395* (2013.01); *H01M 8/04552* (2013.01); *H01M 8/04641* (2013.01); *H01M 8/04701* (2013.01); *H01M 8/04746* (2013.01); *H01M 8/04865* (2013.01); *H01M 8/04895* (2013.01); *H01M 8/045* (2013.01); *H01M 8/04447* (2013.01); *H01M 8/04507* (2013.01); *H01M 8/04529* (2013.01)

(58) Field of Classification Search
None
See application file for complete search history.

(56) References Cited

U.S. PATENT DOCUMENTS

2008/0081235 A1   4/2008 Yamaga et al.

OTHER PUBLICATIONS

Chen et al. Optimization of purge cycle for dead-ended anode fuel cell operation, International Journal of Hydrogen Energy 38, Mar. 9, 2013, pp. 5092-5105.*

(Continued)

*Primary Examiner* — Sarah A. Slifka
(74) *Attorney, Agent, or Firm* — Oblon, McClelland, Maier & Neustadt, L.L.P.

(57) ABSTRACT

A method for observing a state of an electrochemical system including a fuel cell including the following steps: measuring parameters that are representative of the fuel cell in operation; forming a control vector; forming a measurement vector; calculating a temporal variation, referred to as a non-corrected temporal variation; calculating a corrective term in sliding mode; calculating an estimate of the state of the electrochemical system; reiterating above steps while incrementing the measurement time.

8 Claims, 5 Drawing Sheets

(51) Int. Cl.
*H01M 8/04298* (2016.01)
*H01M 8/0432* (2016.01)
*H01M 8/0438* (2016.01)
*H01M 8/04537* (2016.01)
*G01R 31/367* (2019.01)
*G01R 31/3842* (2019.01)
*H01M 8/0444* (2016.01)
*H01M 8/04492* (2016.01)

(56) References Cited

OTHER PUBLICATIONS

French Preliminary Search Report and Written Opinion dated Jul. 24, 2017 in Patent Application No. 1750165 (with English translation of categories of cited documents) citing references AA, and AV-AY therein, 11 pages.

French Preliminary Search Report and Written Opinion dated Jul. 24, 2017 in Patent Application No. 1750165 (with English translation of categories of cited documents), 11 pages.

Yong-Song Chen, et al. "Implementation and evaluation for anode purging of a fuel cell based on nitrogen concentration", Applied Energy, vol. 113, XP028763069, 2013, pp. 1519-1524.

Jixin Chen, et al. "Optimization of purge cycle for dead-ended anode fuel cell operation", International Journal of Hydrogen Energy, vol. 38, No. 12, XP055392109, 2013, pp. 5092-5105.

Maxime Piffard, et al. "Control by state observer of PEMFC anodic purges in dead-end operating mode", IFAC-PapersOnLine, vol. 48, No. 15, XP055391591, 2015, pp. 237-243.

Christophe Robin, et al. "Development and experimental validation of a PEM fuel cell 2D-model to study heterogeneities effects along large-area cell surface", International Journal of Hydrogen Energy, vol. 40, No. 32, XP55237638, pp. 10211-10230.

\* cited by examiner

METHOD AND DEVICE FOR OBSERVING A STATE OF A FUEL-CELL ELECTROCHEMICAL SYSTEM

TECHNICAL FIELD

The present invention relates to a method and a device for observing an electrochemical system including a fuel cell. It also relates to a control system including such an observation method and device, suitable for controlling the purging of the anodic distribution circuit of the fuel cell.

STATE OF THE PRIOR ART

A fuel cell is formed from a stack of electrochemical cells, each including an anode and a cathode that are electrically separated from one another by an electrolyte, in which an electrochemical reaction takes place between two reactants that are introduced continuously. In the case of a hydrogen fuel cell, the fuel (hydrogen) is introduced in contact with the anode, whereas the oxidant (oxygen), for example contained in air, is introduced in contact with the cathode. The reaction is subdivided into two half-reactions, an oxidation and a reduction, which take place one at the anode/electrolyte interface and the other at the cathode/electrolyte interface. It requires the presence of an ion conductor between the two electrodes, namely the electrolyte, and an electron conductor formed by the external electrical circuit. The stack of cells is the site of the electrochemical reaction: the reactants must be introduced therein, the products and the non-reactive species must be discharged therefrom, and also the heat produced.

At the fuel cell outlet, two configurations are customarily encountered. In a first case corresponding to an operation in a mode referred to as open mode, the anode and cathode outlets communicate with a fluid discharge pipe. Thus, when the fuel cell is supplied superstoichiometrically (ratio between the amount of reactant injected and the amount of reactant consumed greater than 1), the outgoing gas has a sufficient flow rate to discharge the water produced by the reaction, which may then be collected using a phase separator. To avoid losing the unconsumed reactant, a recirculation device is customarily provided, which reinjects the unconsumed reactant into the fuel cell inlet. However, due to the fluidic recirculation, the non-reactive species, such as nitrogen at the anode in the case of air being supplied at the cathode, see their molar concentration gradually increase, which makes it necessary to regularly carry out a step of purging the cell.

In a second case corresponding to an operation in a mode referred to as dead-end mode, the outlet of the anode is blocked and also, where appropriate, that of the cathode, and the fuel cell is supplied with reactants with a stoichiometric ratio substantially equal to 1, in particular in respect of hydrogen. Thus, the amount of hydrogen introduced at the anode corresponds to the amount consumed during the reaction. In this case, the non-reactive species and the liquid water produced are not discharged, which leads to a gradual increase in their molar concentration on the anodic side in the cell. It is then necessary to regularly carry out a step of purging the cell, in order to discharge the non-reactive species and liquid water therefrom.

In both cases, it may be useful to have knowledge of the values of parameters, such as the amount of nitrogen and of water at the anode, in order to control the opening of a purge valve linked to the anodic distribution circuit. However, these parameters cannot always be measured directly or cannot be measured in real time. Therefore, based on a representation of the state of the fuel-cell electrochemical system, it is possible to estimate a state of the electrochemical system, the state variables of which include the amount of nitrogen and/or of water at the anode, on the basis of a control vector and of a measurement vector, the components of which are measurable parameters of the system. Such an observation device, or state observer, therefore forms a software sensor for the electrochemical system.

The publication by Piffard et al, entitled *Control by state observer of PEMFC anodic purges in dead-end operating mode*, IFAC-PapersOnLine, 48-15 (2015) 237-243, describes an example of an observation device that is suitable for providing an estimate of a state of an electrochemical system, the fuel cell of which operates in dead-end mode. On the basis of the estimated value of the state variable that is representative of the amount of nitrogen at the anode, the command for the purging of the anodic distribution circuit is then issued.

The observation device receives a control vector U such that $U=[Q_{ao}; T; I]$, the terms of which are a purge signal $Q_{ao}$ corresponding to the opening ($Q_{ao}=1$) and to the closing ($Q_{ao}=0$) of the purge valve, a measurement of a temperature T of a heat transfer fluid of the cooling circuit, and a measurement of the electric current I delivered by the fuel cell. It also receives a measurement vector Y such that $Y=[R_m]$, the single term of which is a value of the ohmic resistance $R_m$ of the electrolytic membrane. On the basis of the control U and measurement Y vectors, it provides an estimate of a state X such that $X=[n_{N_2}^a; n_{H_2O}^a; n_{H_2O}^c; \lambda_m]$, the state variables of which are representative of an amount of nitrogen at the anode $n_{N_2}^a$, of the amounts of water at the anode $n_{H_2O}^a$ and at the cathode $n_{H_2O}^c$, and of an amount of water $\lambda_m$ in the membrane. The state estimate is provided by using an unscented Kalman filter (UKF).

However, one particular drawback of the observation device is that it has to make use of restrictive assumptions on the temporal variation of the pressure and of the temperature within the fuel cell, these assumptions being necessary for the adjustment of the UKF algorithm.

DISCLOSURE OF THE INVENTION

The object of the invention is to overcome, at least in part, the drawbacks of the prior art, and more particularly to provide a method for observing a state of an electrochemical system including a fuel cell that is formed from at least one electrochemical cell comprising an anode and a cathode separated from each other by a membrane, further including an anodic distribution circuit for distributing hydrogen that is linked to an anodic fluid discharge line provided with a purge valve controlled on the basis of a signal, referred to as the purge signal, and a cathodic distribution circuit for distributing oxygen.

The method includes the following steps:
a) measuring, at a measurement time, an electric current of the fuel cell, a voltage of the fuel cell, an anodic pressure of the anodic distribution circuit, a cathodic pressure of the cathodic distribution circuit, and a temperature of the fuel cell;
b) forming a control vector on the basis of the purge signal and of the measurements of the electric current, of the temperature and of the cathodic pressure;
c) forming a measurement vector on the basis of an ohmic resistance value of the membrane deduced from the measurements of the electric current and of the voltage, and on the basis of the measurement of the anodic pressure;

d) calculating a non-corrected temporal variation, on the basis of a prior estimate of the state and of the control vector, based on a predetermined representation of the state of the electrochemical system, the state being formed from state variables that are representative of the amounts of nitrogen and of hydrogen at the anode, and of the amounts of water at the anode, at the cathode, and in the membrane;

e) calculating a corrective term in sliding mode on the basis of a difference between the measurement vector and a measurement estimate of the measurement vector obtained on the basis of a prior estimate of the state;

f) calculating an estimate of said state of the electrochemical system for the measurement time, on the basis of the non-corrected temporal variation and of the corrective term;

g) reiterating steps a) to f) while incrementing the measurement time, the prior estimate of steps d) and e) then corresponding to the state estimate calculated in the preceding iteration.

Certain preferred but non-limiting aspects of this observation method are the following.

The difference may be equal to the difference between the measurement vector and the measurement estimate.

The measurement estimate may be calculated on the basis of the state estimate calculated at the preceding measurement time, based on a predetermined model expressing a relationship between the measurement vector, the state and the control vector.

The corrective term may be equal to the product of a predetermined gain parameter and a sign function applied to the difference.

The state vector may be defined such that $X=[n_{N_2}^a; n_{H_2O}^a; n_{H_2O}^c; \lambda_m; n_{H_2}^a]$, the control vector may be defined such that $U=[Q_{ao}, I, T, P^c]$, and the measurement vector may be defined such that $Y=[R_m; P^a]$.

Step f) of calculating the state estimate may include a step of calculating a term, referred to as a state estimate variation term, the terms of which are written as:

$$\begin{cases} \dot{\hat{x}}_1 = f_1(\hat{x}, u) - \sigma_1 \cdot \text{sign}(s_2) \\ \dot{\hat{x}}_2 = f_2(\hat{x}, u) - \sigma_2 \cdot \text{sign}(s_2) \\ \dot{\hat{x}}_3 = f_3(\hat{x}, u) - \sigma_3 \cdot \text{sign}(s_1) \\ \dot{\hat{x}}_4 = f_4(\hat{x}, u) - \sigma_4 \cdot \text{sign}(s_1) \\ \dot{\hat{x}}_5 = f_5(\hat{x}, u) - \sigma_5 \cdot \text{sign}(s_2) \end{cases}$$

where $f_{i=1-5}$ are the terms of said state representation, $\sigma_{i=1-5}$ are the terms of a gain parameter, and $s_{i=1,2}$ are the terms of said difference, which are defined by $s_1=y_1-\hat{y}_1$ and $s_2=y_2-\hat{y}_2$, where $y_1$ and $y_2$ are the terms of the measurement vector, and where $\hat{y}_1$ and $\hat{y}_2$ are the terms of the measurement estimate.

The gain parameter may be determined so as to verify the functions $\dot{V}_1=s_1\dot{s}_1<0$ and $\dot{V}_2=s_2\dot{s}_2<0$.

The invention also pertains to a device for observing a state of an electrochemical system including a fuel cell that is formed from at least one electrochemical cell comprising an anode and a cathode separated from each other by a membrane, further including an anodic distribution circuit for distributing hydrogen that is linked to an anodic fluid discharge line that is provided with a purge valve controlled on the basis of a purge signal, and a cathodic distribution circuit for distributing oxygen, the observation device including:

sensors that are suitable for delivering, for successive measurement times, measurements of an electric current of the fuel cell, a voltage of the fuel cell, an anodic pressure of the anodic distribution circuit, a cathodic pressure of the cathodic distribution circuit, and a temperature of the fuel cell;

a computer that is configured to implement the observation method according to any one of the preceding features, at each measurement time.

BRIEF DESCRIPTION OF THE DRAWINGS

Other aspects, aims, advantages and features of the invention will become more clearly apparent upon reading the following detailed description of preferred embodiments thereof, which description is provided by way of non-limiting example and with reference to the appended drawings, in which.

DETAILED DESCRIPTION OF PARTICULAR EMBODIMENTS

In the figures and in the subsequent description, the same references represent identical or similar elements. Moreover, the various elements are not represented to scale so as to enhance the clarity of the figures. Furthermore, the various embodiments and variants are not mutually exclusive and may be combined with one another. Unless indicated otherwise, the terms "substantially", "about" and "of the order of" mean to within 10%.

Figure 1:
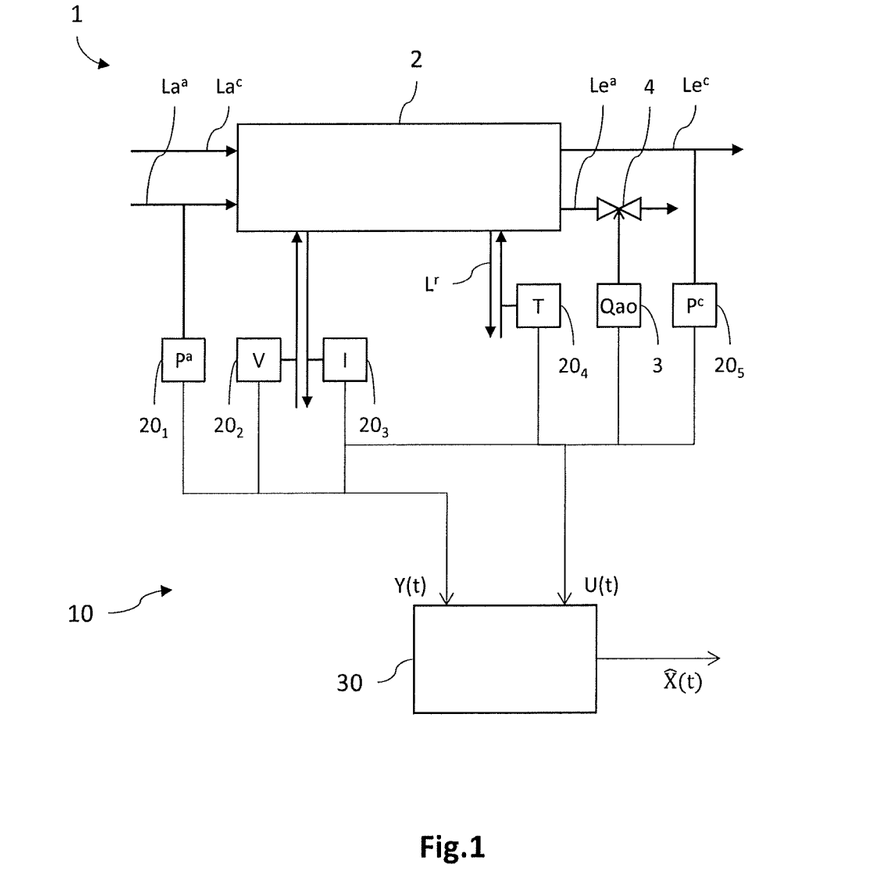
FIG. 1 is a partial schematic view of a fuel-cell electrochemical system, connected to a device for observing the electrochemical system according to one embodiment, including a set of measurement sensors and a computer that is suitable for providing an estimate of a state of the electrochemical system on the basis of the measurements from the sensors.

FIG. 1 schematically illustrates a fuel-cell 2 electrochemical system 1 provided with measurement sensors 20 of an observation device 10 according to one embodiment. The observation device 10 is suitable for providing an estimate of a state X of the electrochemical system 1.

The electrochemical system 1 includes a fuel cell 2 and a device 3 for purging the anodic discharge circuit of the fuel cell 2. A hydrogen fuel cell will be considered in particular here, this fuel cell being supplied with hydrogen on the anode side and with air containing oxygen on the cathode side. However, the invention is applicable to any type of fuel cell, and in particular to those operating at low temperatures, i.e. temperatures below 250° C.

The fuel cell 2 includes at least one electrochemical cell, and preferably a stack of electrochemical cells. Each cell includes an anode and a cathode that are separated from each other by an electrolytic membrane, this assembly forming a membrane-electrode assembly (MEA). The anode, the membrane and the cathode are conventional elements that are known to those skilled in the art and are therefore not described in detail. Each assembly is separated from that of the adjacent cells by bipolar plates, which are suitable for bringing reactive species both to the anode of a first cell and to the cathode of an adjacent cell, and for removing products arising from the electrochemical reactions and unreactive species, as well as transmitting electric current between the cells. It may also ensure that a heat transfer fluid flows between the cells so as to allow the heat produced to be removed.

The fuel cell 2 includes an anodic distribution circuit that is suitable for bringing hydrogen to the anode of the electrochemical cells, which extends between an inlet manifold and an outlet manifold. Similarly, it includes a cathodic distribution circuit that is suitable for bringing oxygen to the cathode of the electrochemical cells, which extends between an inlet manifold and an outlet manifold. Thus, the anodic and cathodic inlet manifolds are suitable for ensuring the fluidic injection of supply gases into the electrochemical cells, and the outlet manifolds are suitable for removing unreacted supply gases and unreactive species from the electrochemical cells and from the fuel cell. The anodic and cathodic distribution circuits are supplied with reactive gases by fluid supply lines $La^a$, $La^c$ that are linked to the inlet manifolds, and fluid discharge lines $Le^a$, $Le^c$ are linked to the outlet manifolds.

The fuel cell additionally includes a cooling circuit that extends at the level of the electrochemical cells. The cooling circuit is suitable for circulating a heat transfer fluid that is intended to remove the heat produced during the electrochemical reaction from the fuel cell. The cooling circuit is linked to fluid cooling lines $L^r$ that are suitable for injecting and removing the heat transfer fluid into/from the cooling circuit.

The electrochemical system 1 also includes a purging device 3 for purging the anodic distribution circuit. For this purpose, it includes a purge valve 4 that is positioned here on the anodic discharge line $Le^a$ in order to allow the fluids that may accumulate in the anodic distribution circuit to be briefly purged. Thus, the purge valve 4, is a controlled-opening valve, i.e. its opening and its closing are controlled on the basis of a control signal Qao. In this example, the fuel cell 2 operates in dead-end mode but it could also operate in recirculation mode.

The observation device 10 is suitable for providing a real-time estimate $\hat{X}(t)$ of a state X(t) of the electrochemical system 1 on the basis of information provided by a control vector U(t) and a measurement vector Y(t).

For this purpose, the observation device 10 includes sensors 20 that are suitable for providing signals representative of excitation and/or response parameters associated with the operation of the electrochemical system 1, the values of which allow the control U(t) and measurement Y(t) vectors of the observation system 10 to be formed. It is also electrically connected to the control device 3 for controlling the purge valve 4 in order to receive the control signal $Q_{ao}$. The control signal $Q_{ao}$ takes, in this example, a value that is equal to unity in the event of purging the anodic circuit, and a zero value when the purge valve 4 is closed. As a variant, the signal $Q_{ao}$ may take a value comprised between 0 and 1, relating to the degree of opening of the purge valve.

Thus, the observation device includes a pressure sensor $20_1$ that is suitable for delivering a real-time measurement of an anodic pressure $P^a$ of the gas flowing through the anodic distribution circuit. By way of example, the measurement may be made at the inlet or outlet manifold of the anodic distribution circuit. It also includes a voltage sensor $20_2$ that is suitable for delivering, in real time, a measurement of the voltage V of the fuel cell, as well as a current sensor $20_3$ that is suitable for delivering, in real time, a measurement of the electric current I delivered by the fuel cell 2 in response to the demands of an electrical load. The observation device further includes a computing means (not shown) for calculating a value of an ohmic resistance $R_m$ of the electrolytic membrane, on the basis of the measured values of the electric current I and of the voltage V. The value of the ohmic resistance Rm deduced from the measurements of the electric current I and of the voltage V, as well as the measured value of the anodic pressure $P^a$, form the parameters of the measurement vector Y(t).

The observation device 10 also includes a temperature sensor $20_4$ that is suitable for delivering a real-time measurement of a temperature T of the fuel cell, for example a temperature of the heat transfer fluid flowing through the cooling circuit. By way of illustration, the temperature T may be measured at the outlet of the cooling circuit. It includes a pressure sensor $20_5$ that is suitable for delivering a real-time measurement of a cathodic pressure $P^c$ of the gas flowing through the cathodic distribution circuit. By way of example, the measurement may be made at the inlet or outlet manifold of the cathodic circuit. The control signal $Q_{ao}$, the measurement of the electric current I, the measurement of the cooling temperature T, and the measurement of the cathodic pressure $P^c$ form the parameters of the control vector U(t). The measured values of the parameters of the control and measurement vectors vary with time.

The observation device includes a computer 30 that is suitable for providing, in real-time, the estimate $\hat{X}(t)$ of the state X(t) of the electrochemical system on the basis of the control vector U(t) and of the measurement vector Y(t).

Figure 2A:
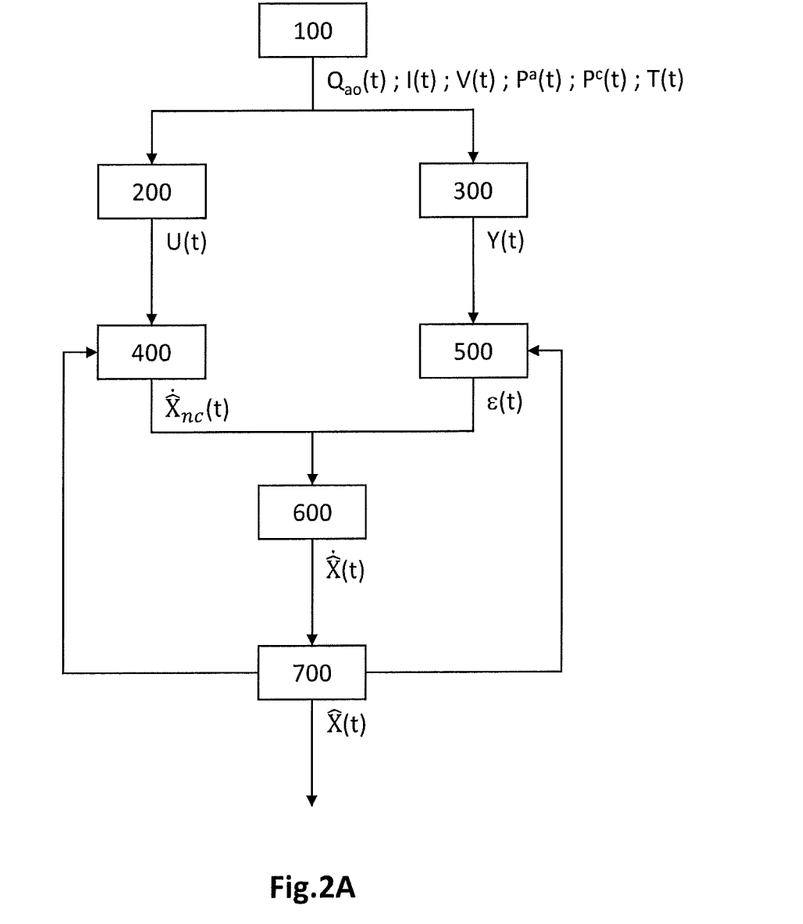
FIG. 2A is a flow chart illustrating the calculation steps implemented by an observation method according to one embodiment.

FIG. 2A illustrates a flow chart of an observation method according to the embodiment. The method is based here on a state observer of the sliding-mode class of observers. It is suitable for providing, in real time, an estimate $\hat{X}(t)$ of a state X(t) of the electrochemical system 1 on the basis of information provided by a control vector U(t) and a measurement vector Y(t), and based on a dynamic model of the system, referred to as a state representation, expressing the temporal variation $\dot{X}(t)$ of the state X(t), taking into account a corrective term in sliding mode.

More specifically, the steps of the observation method are carried out at successive measurement times $t_k$. The time is discretized according to a temporal sampling interval $\Delta t$. The steps of the method are reiterated on each incrementation k+1 of the measurement time. Throughout the remainder of the description, the notations X(t), U(t), Y(t), etc. are understood to be the values of the vectors X, U, Y, etc. at the measurement time under consideration.

The state representation of the electrochemical system 1 is defined by the following system of equations (1):

$$\begin{cases} \dot{X} = f(X, U) \\ Y = h(X, U) \end{cases} \quad (1)$$

where f is the state function and h is the observation function.

The sliding-mode observer of the electrochemical system 1 is defined by the following system of equations (2):

$$\begin{cases} \dot{\hat{X}} = f(\hat{X}, U) - K \cdot \text{signs}(S) \\ \hat{Y} = h(\hat{X}, U) \end{cases} \quad (2)$$

where K is a gain parameter and where S is a term, referred to as a sliding surface term, which is preferably defined as the difference between the estimate $\hat{Y}$ and the measurement vector Y: $S=Y-\hat{Y}$. Thus, the observer includes a term, referred to as a corrective term, i.e. K.sign(S), that allows the difference S between the estimate $\hat{Y}$ and the measurement vector Y to be minimized, and thus the convergence of the estimate R towards a supposedly real state X to be established.

In a step 100, the observation device 10 measures, at measurement time $t_k$, the values of the purge signal $Q_{ao}$, of the electric current I and of the voltage V of the fuel cell, of the anodic pressure $P^a$ and of the cathodic pressure $P^c$, and of the temperature T of the heat transfer fluid.

In a step 200, the control vector U, of dimension 4, is formed, for measurement time $t_k$, on the basis of the parameters that are representative of the purge signal $Q_{ao}$, of the measured electric current I, of the measured temperature T, and of the measured cathodic pressure $P^c$. Thus, the control vector U is written as: $U=[Q_{ao}; I; T; P^c]$ where $Q_{ao}$ is, in this example, a value that is equal to 1 or 0 depending on whether the purge valve is opening or closing.

In a step 300, the measurement vector Y, of dimension 2, is formed, for measurement time $t_k$, on the basis of the parameters that are representative of the ohmic resistance $R_m$ of the electrolytic membrane and of the anodic pressure $p^a$. Thus, the measurement vector Y may be written as: $Y=[R_m; P^a]$ where $R_m$ is the value of the ohmic resistance of the membrane, deduced from the value of the electric current I measured by the current sensor and from the value of the voltage V measured by the voltage sensor.

Such a formation of the control U and measurement Y vectors allows a state X, of dimension 5, to be observed for measurement time $t_k$, including state variables that are representative of an amount of nitrogen at the anode, of an amount of water at the anode, at the cathode and in the membrane, and of an amount of hydrogen at the anode. Thus, the state vector may be written as: $X=[n_{N_2}^a; n_{H_2O}^a; n_{H_2O}^c; \lambda_m; n_{H_2}^a]$ where $n_{N2}^a$ is the number of moles of nitrogen in the anodic circuit; $n_{H2O}^a$ and $n_{H2O}^c$ is the number of moles of water in liquid and gas phase, respectively, in the anodic circuit and in the cathodic circuit; $\lambda_m$ is the number of moles of water in the electrolytic membrane; and where $n_{H2}^a$ is the number of moles of hydrogen in the anodic circuit.

Stated otherwise, the control U(t), measurement Y(t), and state X(t) vectors are written as:

$$U = \begin{bmatrix} Q_{ao} \\ I \\ T \\ P^c \end{bmatrix} \quad Y = \begin{bmatrix} R_m \\ P^a \end{bmatrix} \quad X = \begin{bmatrix} n_{N_2}^a \\ n_{H_2O}^a \\ n_{H_2O}^c \\ \lambda_m \\ n_{N_2}^a \end{bmatrix} \quad (3)$$

In a step 400, a temporal variation, referred to as a non-corrected temporal variation $\dot{\hat{X}}_{nc}$, of the estimate $\hat{X}$ of the state X is calculated, for measurement time $t_k$, on the basis of the control vector U and of a prior estimate $\hat{X}$, based on the observation function f mentioned above, formalized here on the basis of a model described in the publication by Robin et al entitled *Development and experimental validation of a PEM fuel cell 2D-model to study heterogeneities effects along large-area cell surface*, Int. J. Hydrogen Energy, 40 (2015) 10211-10230, and expressed by the following system of equations:

$$\begin{cases} \dot{x}_1 = f_1(x,u) \\ \dot{x}_2 = f_2(x,u) \\ \dot{x}_3 = f_3(x,u) \\ \dot{x}_4 = f_4(x,u) \\ \dot{x}_5 = f_5(x,u) \end{cases} \Leftrightarrow \begin{cases} \dot{n}_{N_2}^a = K_{N_2} - F_{P,N_2} \\ \dot{n}_{H_2O}^a = F_d^a - F_{eo} - F_{P,H_2O} \\ \dot{n}_{H_2O}^c = F_d^c + F_{eo} + \frac{I}{2F} + F_{in} - F_{out} \\ \dot{\lambda}_m = \frac{EW}{\rho_d e_m S}(-F_d^a - F_d^c) \\ \dot{n}_{H_2}^a = F_{in,H_2} - \frac{I}{2F} - F_{P,H_2} \end{cases} \quad (4)$$

where the following parameters are in particular defined in the publication by Robin 2015:

$K_{N_2}$ is the nitrogen permeation flow from the cathode to the anode through the membrane, which depends in particular on the state variables $\lambda_m$ and $n_{N2}^a$, and on the control variables T and $P^c$;

$F_{P,X}$ is the purge flow of the species X to the outlet of the anodic distribution circuit, which depends in particular on the state variables $n_{N_2}^a$, $n_{H_2}^a$ and $n_{H_2O}^a$, and on the control variable $Q_{ao}$;

$F_d^a$ and $F_d^c$ are the water diffusion flows through the membrane to the anode and to the cathode, respectively, which depend in particular on the state variables $\lambda_m$ and on $n_{H_2O}^a$ or $n_{H_2O}^c$, respectively, and on the control variable T;

$F_{eo}$ is the electroosmotic flow of water through the membrane, which depends in particular on the state variable $\lambda_m$ and on the control variable I;

$F_{in}$ and $F_{out}$ are the water flows entering and exiting, respectively, the cathodic distribution circuit, which depend in particular on the control variables I, T, $P^c$;

$F_{in,H_2}$ is the hydrogen flow entering the cathodic distribution circuit, which depends in particular on the state variables $n_{N_2}^a$, $n_{H_2}^a$ and $n_{H_2O}^a$, and on the control variable T;

F is the Faraday constant, EW is the equivalent weight of the membrane, $\rho_d$ is the density of the dry electrolytic membrane, $e_m$ and S are the thickness and the area of the membrane.

The prior state estimate $\hat{X}$ may be equal, in the first temporal iteration $t_{k=1}$, i.e. during the initialization of the observation method, to predefined initial values of the state vector $X(t_{k=0})$. In the subsequent temporal iterations $t_k$, the prior state estimate corresponds to the value calculated in step 700 at the preceding measurement time $t_{k-1}$.

In a step 500, the corrective term ε in sliding mode is calculated, for measurement time $t_k$, on the basis of the measurement vector Y defined in step 300 and on the basis of the same prior state estimate value $\hat{X}$, calculated at the preceding measurement time $t_{k-1}$ as for step 400. It has a formulation in sliding mode, i.e. it is equal to K.sign(S), where K is a predetermined gain parameter, where sign(.) is the discontinuous sign function, and where S is a sliding surface calculated on the basis of a difference between the measurement vector Y and an estimate, referred to as a measurement estimate $\hat{Y}$, of the measurement vector Y. This step is described below, with reference to FIG. 2B.

In a step 600, a temporal variation $\dot{\hat{X}}$ is calculated for measurement time $t_k$ on the basis of the non-corrected temporal variation $\dot{\hat{X}}_{nc}$ and of the corrective term ε, here by differencing between $\dot{\hat{X}}_{nc}$ and ε.

In a step 700, the estimate $\hat{X}$ of the state vector X is calculated, for measurement time $t_k$, by temporal integration of the temporal variation $\dot{\hat{X}}$ obtained in step 600.

The observation method includes the successive temporal reiteration of steps 100 to 700, by incrementing the measurement time $t_k$, so as to provide, in real time, the state estimate $\hat{X}(t)$ on the basis of the updated control U(t) and measurement Y(t) vectors. The value of the state estimate $\hat{X}(t)$ calculated in the previous step 700 in a temporal iteration $t_k$ is taken into account in the subsequent temporal iteration $t_{k+1}$ as a "prior state estimate" for steps 400 and 500. The observation method thus includes two closed loops that each take into account the value of the estimate $\hat{X}(t)$ calculated in the previous step 700, one associated with the calculation of the non-corrected temporal variation and the other associated with the corrective term. Thus, the minimization of the difference S(t) between the measurement estimate $\hat{X}(t)$ and the measurement vector Y(t) takes place gradually over time. In this respect, as described below, the gain parameter K is predetermined such that convergence is reached at a more or less constrained finite time.

Thus, for the state X(t) defined beforehand, the formation of the control U(t) and measurement Y(t) vectors on the basis of the purge signal and of the measurements from the sensors makes it possible to ensure the observability of the electrochemical system 1, i.e. the fact that the observation device 10 is capable of providing an estimate $\hat{X}(t)$ of the state X(t) for any time period $[t_i; t_f]$ on the basis of the information provided by the control U(t) and measurement Y(t) vectors.

Moreover, it appears that at least one variable of the measurement vector Y(t), namely here the anodic pressure $P^a$, depends in particular on the state variables $n_{H_2}^a$ and $n_{H_2}^a$ that are representative of the amount of nitrogen and of hydrogen in the anodic circuit. Thus, the observation device makes it possible to effectively observe the state variables $n_{N_2}^a$ et $n_{H_2}^a$. This is also the case for the state variable $n_{H_2O}^a$ insofar as the anodic pressure $P^a$ depends in particular on $n_{H_2O}^a$. By "observe", it is understood that the estimated state variables $n_{N_2}^a$ and $n_{H_2}^a$ do indeed converge towards the values that are assumed to be the actual values, due to the sliding-mode correction that minimizes the difference between the estimate $\hat{Y}$ and the measurement vector Y.

The observation method further has the advantage of not needing humidity sensors to be used to deliver measurements of the amount of water in the anodic and cathodic distribution circuits. It also makes it possible to provide, in real time, the estimate $\hat{X}$ of the state X without having to make use of restrictive assumptions on the temporal variation in terms of pressure and of temperature of the fuel cell.

Figure 2B:
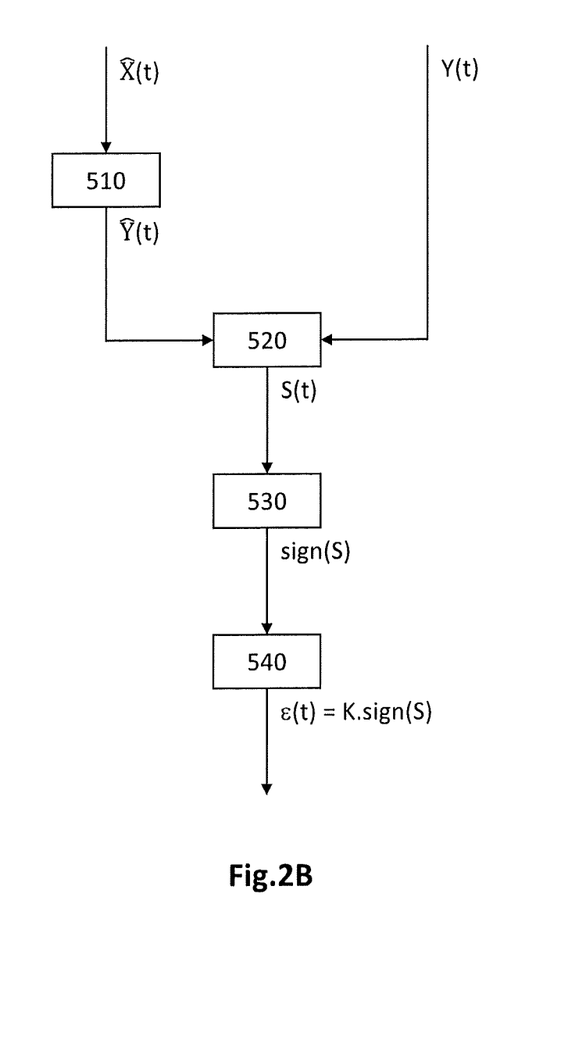
FIG. 2B is a flow chart showing the steps of calculating the corrective term.

FIG. 2B illustrates, in detail, step 500 of calculating the corrective terms in sliding mode of the observation method illustrated in FIG. 2A.

In a step 510, the estimate $\hat{Y}$ is calculated, for measurement time $t_k$, on the basis of a prior estimate $\hat{X}$ of the state X, based on the predetermined observation function h expressed here by the following system of equations:

$$\begin{cases} y_1 = h_1(\hat{x}, u) \\ y_2 = h_2(\hat{x}, u) \end{cases} \Leftrightarrow \begin{cases} R_m = \dfrac{e_m}{S} \dfrac{1}{33.75\lambda_m - 21.41} e^{\frac{1268}{T}} \\ P^a = (n_{N_2}^a + n_{H_2}^a + n_{H_2O}^a)\dfrac{RT}{V} \end{cases} \quad (5)$$

As mentioned above, the prior state estimate $\hat{X}$ may correspond, in the first temporal iteration $t_{k=1}$, i.e. during the initialization of the observation method, to predefined initial values of the state vector $X(t_{k=0})$. In the subsequent temporal iterations, the prior state estimate $\hat{X}$ corresponds to the value calculated in step 700 at the preceding measurement time $t_{k-1}$.

In a step 520, a sliding surface S, defined as the difference between the estimate $\hat{Y}$ and the measurement value Y, is calculated for measurement time $t_k$, such that:

$$\begin{cases} s_1 = y_1 - \hat{y}_1 \\ s_2 = y_2 - \hat{y}_2 \end{cases} \quad (6)$$

In a step 530, the sign function of the sliding surface S, defined such that it is equal to 1 when S is positive, zero when S is zero and equal to −1 when S is negative, is calculated for measurement time $t_k$.

In a step 540, the corrective term ε=K.sign(S) is calculated for measurement time $t_k$, such that:

$$\begin{cases} \varepsilon_1 = \sigma_1 \mathrm{sign}(s_2) \\ \varepsilon_2 = \sigma_2 \mathrm{sign}(s_2) \\ \varepsilon_3 = \sigma_3 \mathrm{sign}(s_1) \\ \varepsilon_4 = \sigma_4 \mathrm{sign}(s_1) \\ \varepsilon_5 = \sigma_5 \mathrm{sign}(s_2) \end{cases} \quad (7)$$

where the terms $\varepsilon_i$ are the corrective terms, $\sigma_i$ are the terms of the gain parameter K. The term $s_2$ of the sliding surface is associated solely with the terms $\varepsilon_1$, $\varepsilon_2$ and $\varepsilon_5$, and hence with the state variables $x_1$, $x_2$ and $x_5$, insofar as these variables $s_2$ and $\varepsilon_1$, $\varepsilon_2$ and $\varepsilon_5$ relate to the anode.

The sign function applied to the sliding surface S is thus multiplied by the gain parameter K. The terms of the gain are predetermined so as to ensure the convergence of the system on the sliding surface S. To achieve this, two functions, referred to as Lyapunov functions, are defined:

$$\begin{cases} V_1 = \dfrac{1}{2}(s_1)^2 \\ V_2 = \dfrac{1}{2}(s_2)^2 \end{cases} \quad (8)$$

By assuming that $$\dfrac{\dot{\lambda}_m}{\lambda_m} \gg \dfrac{\dot{T}_m}{T_m}, \text{ i.e.}$$

by assuming that the dynamic range (temporal variation) associated with the amount of water in the membrane varies more rapidly than that associated with the temperature of the membrane, the temporal variation $\dot{V}_1$ and $\dot{V}_2$ of the Lyapunov functions, here the first derivatives of the terms $V_1$ and $V_2$ with respect to time, may be written as:

$$\begin{cases} \dot{V}_1 = s_1\left(\dot{y}_1 - \frac{dh_1(\hat{x})}{d\hat{x}_4}f_4(\hat{x}, u) + \frac{dh_1(\hat{x})}{d\hat{x}_4}\sigma_4 \text{sign}(s_1)\right) \\ \dot{V}_2 = s_2\left(\dot{y}_2 - \frac{RT}{V_a}\sum_{k=1,2,5} f_k(\hat{x}, u) + \frac{RT}{V_a}\sum_{k=1,2,5} \sigma_k \text{sign}(s_2)\right) \end{cases} \quad (9)$$

The convergence of the system assumes that the temporal variations $\dot{V}_1$ and $\dot{V}_2$ are negative, i.e. that $\dot{V}_1 = s_1\dot{s}_1 < 0$ and $\dot{V}_2 = s_2\dot{s}_2 < 0$, which is reflected by the following conditions on the various terms of the gain parameter K:

$$\begin{cases} \sigma_4 > \max\left|\frac{\dot{y}_1}{\frac{dh_1(\hat{x})}{d\hat{x}_4}} - f_4(\hat{x}, u)\right| \\ \sum_{k=1,2,5} \sigma_k > \max\left|\frac{\dot{y}_2}{\frac{RT}{V_a}} - \sum_{k=1,2,5} f_k(\hat{x}, u)\right| \end{cases} \quad (10)$$

It appears that the terms $\varepsilon_1$, $\varepsilon_2$ and $\varepsilon_5$ of the gain parameter K do not have to be individually adjusted as long their sum meets the above condition. Only the term $\sigma_4$ preferably meets the above criterion.

As a variant, the conditions of convergence on the terms of the gain parameter K may be more restrictive, for example by defining the relative temporal variations $\dot{V}_1/V_1$ and $\dot{V}_2/V_2$ so that they are strictly negative, or even smaller than or equal to a non-zero negative value.

Figure 3:
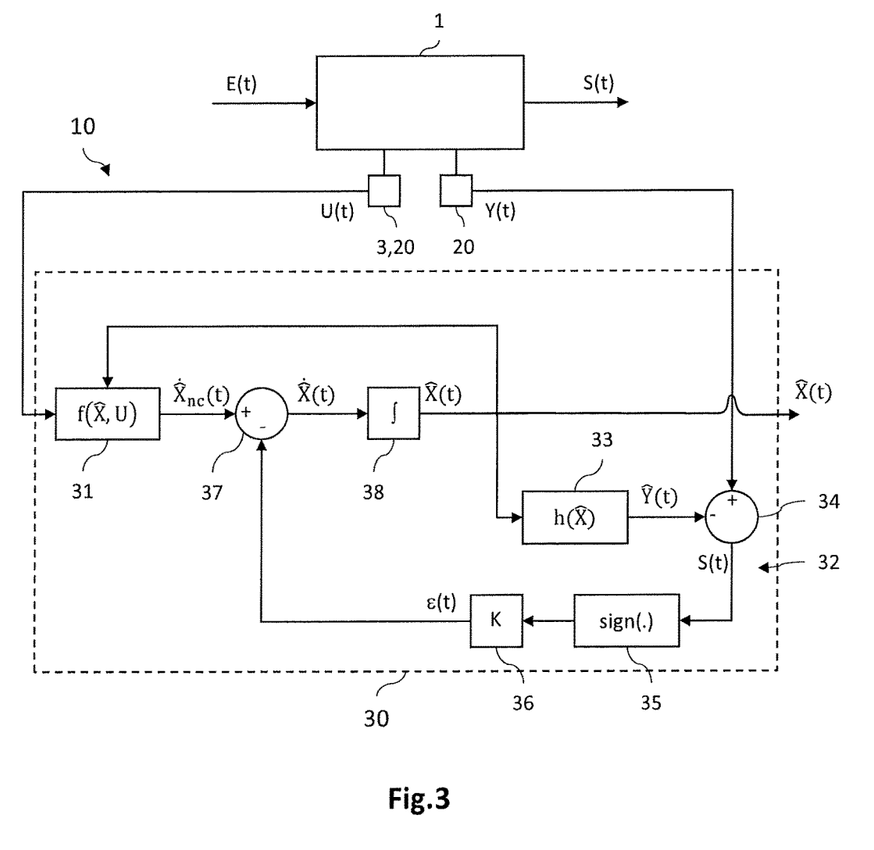
FIG. 3 is a partial schematic view of the electrochemical system and of the observation device according to the embodiment.

FIG. 3 illustrates an exemplary structure of the observation device 10 of the electrochemical system 1. The electrochemical system 1 is subject to fluidic and electrochemical excitations E(t) and reacts dynamically in the form of a response S(t).

The observation device 10 includes the sensors 20 that are suitable for delivering, for each measurement time $t_k$, measurements of the electric current I, of the voltage V, of a temperature T of the heat transfer fluid, of an anodic pressure $P^a$ and of a cathodic pressure $P^c$. It is also suitable for receiving the signal $Q_{ao}$ emitted by the purging device 3.

It also includes a computer 30 formed from conventional software means, such as a processor, random-access and/or read-only memories, digital data transmission buses, etc. in which a state function f and an observation function h are implemented, along with a sliding-mode observation algorithm (system of equations (2) mentioned above).

The computer includes a module, referred to as a variation module 31, in which the state function f of the state representation is implemented. This variation module 31 is suitable for calculating, for each measurement time $t_k$, the temporal variation, referred to as the non-corrected temporal variation $\dot{\hat{X}}_{nc}$, of the state estimate $\hat{X}$, while taking into account the control vector U and a prior estimate $\hat{X}$, for example the estimate calculated in step 700 in the preceding temporal iteration $t_{k-1}$.

The observation device 10 also includes a module, referred to as a correction module 32, that is capable of delivering, for each measurement time $t_k$, the corrective term $\varepsilon(t)$, expressed in sliding mode, allowing the difference S(t) between the measurement vector Y and the measurement estimate $\hat{Y}$ to be minimized. The corrective term $\varepsilon(t)$ is said to be a sliding mode corrective term insofar as it has a formulation of K.sign(S) type, where K is the gain parameter and S is the sliding surface.

The correction module 32 includes a sub-module 33 for calculating the estimate $\hat{Y}$ in which the observation function h is implemented. It is suitable for calculating the estimate $\hat{Y}$ on the basis of a prior estimate $\hat{X}$, for example the estimate calculated in step 700 in the preceding temporal iteration $t_{k-1}$.

It includes a comparator 34 that is suitable for calculating, for each measurement time $t_k$, the sliding surface S(t) as the difference between the measurement vector Y(t) received from the sensors and the measurement estimate $\hat{Y}$ received from the sub-module 33.

It includes a sub-module 35 for applying the sign function to the sliding surface S(t). The sign value (S(t)) is next multiplied by a gain matrix K, the terms of which have been initially predetermined by the sub-module 36, so as to ensure the convergence of the system on the sliding surface S(t). The corrective term $\varepsilon(t)$ is thus obtained. The values of the gain matrix K are thus fixed with time.

The computer 30 includes a comparator 37 that calculates, for each measurement time $t_k$, the temporal variation $\dot{\hat{X}}(t)$ as the difference between the non-corrected temporal variation $\dot{\hat{X}}_{nc}$, and the corrective term $\varepsilon(t)$. The obtained temporal variation $\dot{\hat{X}}(t)$ is then temporally integrated by the integrator 38 to provide the state estimate $\hat{X}(t)$ of the electrochemical system 1 at measurement time $t_k$.

The convergence of the observation device 10 takes place gradually over time, by means of two closed loops, insofar as the state measurement $\hat{X}(t)$ calculated in one temporal iteration is transmitted both to the input of the correction module 32 and to the input of the variation module 31, for the next temporal iteration.

It is advantageous for the purging device 3 to be connected to the observation device 10. Depending on the estimates of the state variables that are representative of the amount of nitrogen $n_{H_2}^a$ and/or of hydrogen $n_{H_2}^a$ and/or of water $n_{H_2O}^a$ in the anodic distribution circuit, when these estimated values reach predefined maximum values, the purging device 3 may open the purge valve until the estimated values fall below the maximum values, or even until the estimated values become substantially equal to predefined minimum values. This becomes increasingly possible as the delivery of the state estimate $\hat{X}(t)$ by the observation device 10 approaches real time. It is thus possible to control the purging of the anodic distribution circuit to avoid the amounts of nitrogen, of hydrogen and/or of water having a negative effect on the electrochemical performance of the fuel cell.

Figure 4A:
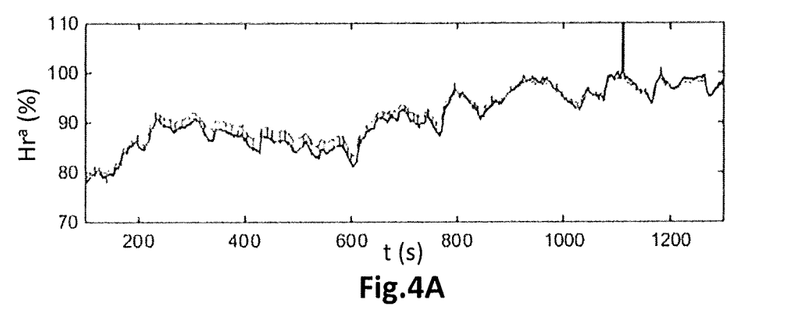
FIGS. 4A to 4C are examples of the temporal variation of the relative humidity at the anode (FIG. 4A) and at the cathode (FIG. 4B), and of the temporal variation of the fraction by volume of nitrogen at the anode (FIG. 4C) in the context of operating an electrochemical system in which the command for the purging of the anodic distribution circuit is issued on the basis of the state estimate provided by the observation device.
Figure 4B:
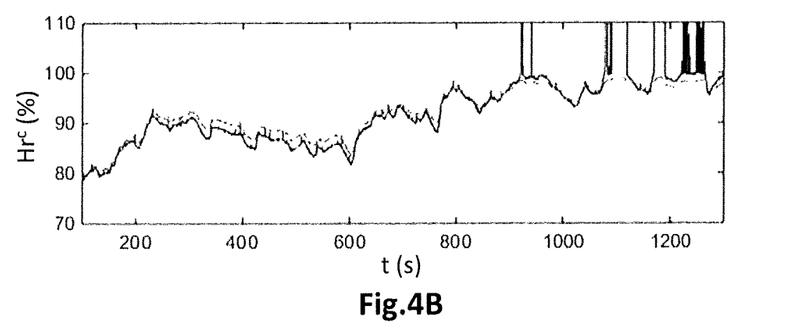
Figure 4C:
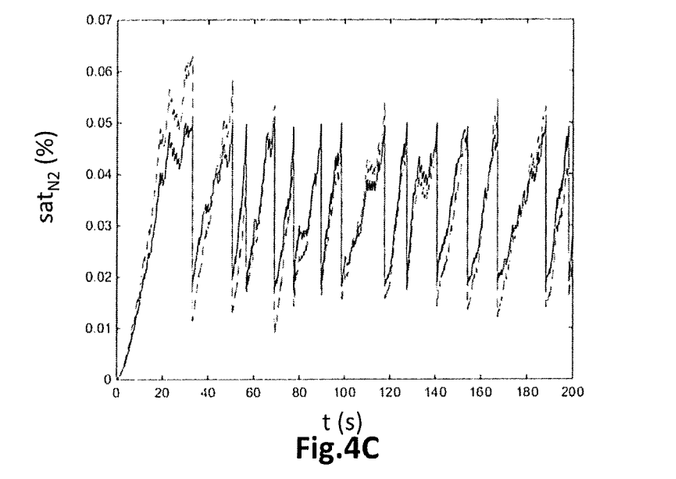

FIGS. 4A to 4C illustrate the temporal variation in the relative humidity at the anode $HR^a$ (FIG. 4A) and at the cathode $HR^c$ (FIG. 4B), as well as the temporal variation in the nitrogen saturation at the anode (FIG. 4C), in the case of controlling the purging of the anodic distribution circuit of a PEM fuel cell operating in dead-end mode. The purge valve is opened when the amount of nitrogen at the anode reaches a predetermined maximum value. The relative humidity and nitrogen saturation parameters are deduced from the state values of the estimate $\hat{X}(t)$ provided by the observation method and device described above.

These temporal variations obtained by the observation method and device according to the embodiment (solid line)

are compared with a physical reference model (dotted line) presented in the publication by Robin 2015 mentioned above.

The electric current I delivered by the fuel cell is deduced from the electric power drawn by an electrical load, the electric power being defined by the Worldwide harmonized Light vehicles Test Procedure (WLTP). The relative humidity is fixed at 0% at the inlet of the anodic distribution circuit and at 50% at the inlet of the cathodic distribution circuit. The oxygen stoichiometry is fixed at 2 at the cathode. That of hydrogen is fixed at 1 at the anode, in accordance with the dead-end operation of the fuel cell. The temperature of the heat transfer fluid is random following a normal Gaussian law, having a mean temperature of 353 K and varying by $10^2$ K, sampled every 10 s, with a variation limited to plus/minus 7 K per second. The cathodic pressure $P^c$ and the anodic pressure $P^a$ are random following a normal Gaussian law, having a mean pressure of 2.105 Pa and varying by $(4.10^4)^2$ Pa, sampled every second, with a variation limited to plus/minus $10^4$ Pa/s.

In this example, the term $\sigma_4$ of the gain parameter K is fixed at no in order to meet the condition determined above, and the terms $\sigma_1$, $\sigma_2$ and $\sigma_5$ are fixed at 0.06, 0.00 and 0.06, respectively, so that their sum meets the condition determined above. The term $\sigma_3$ is fixed at 0.

As illustrated in FIG. 4C, when the purge valve is closed ($Q_{ao}=0$), the nitrogen saturation at the anode tends to increase by diffusion through the membrane, until reaching the predetermined maximum value, here of the order of 0.05%. Once it reaches the maximum value, the purge signal $Q_{ao}$ becomes equal to 1 and the purge valve is opened. The nitrogen saturation at the anode then drops, until the purge valve is closed. The signal thus continues over time. It thus appears that this variable, deduced from the estimate $\hat{X}(t)$ provided by the observation device, is in accordance with the variation of the same variable provided by the model by Robin 2015. The variation in the relative humidities at the anode and at the cathode, deduced from the state variables $n_{H_2O}^a$ and $n_{H_2O}^c$ estimated by the observation device (FIGS. 4A and 4B), are also in good agreement with that given by the reference model by Robin 2015.

Particular embodiments have just been described. Various modifications and variants will be apparent to a person skilled in the art.

The observation method and device described above can be applied equally both to the dead-end mode of operation and to the recirculation mode of operation of a fuel cell. In this case, the anodic outlet manifold is linked to the anodic inlet manifold by a recirculation loop. The command to open a purge valve is issued according to at least one of the variables of the state X of the electrochemical system.

The state function f and the observation function h are here based on a dynamic physical model of the electrochemical system described in particular in the article by Robin 2015 mentioned above. They may be modified according to the knowledge of a person skilled in the art, according to the characteristics of the fuel cell under observation, or even based on other electrochemical models.

The invention claimed is:

1. A method for observing a state (X) of an electrochemical system comprising a fuel cell that is formed from at least one electrochemical cell comprising an anode and a cathode separated from each other by a membrane, further comprising an anodic distribution circuit for distributing hydrogen that is linked to an anodic fluid discharge line provided with a purge valve controlled on the basis of a purge signal ($Q_{ao}$), and a cathodic distribution circuit for distributing oxygen, said method comprising the following steps:

a) measuring, at a measurement time ($t_k$), an electric current (I) of the fuel cell, a voltage (V) of the fuel cell, an anodic pressure ($P^a$) of the anodic distribution circuit, a cathodic pressure ($P^c$) of the cathodic distribution circuit, and a temperature (T) of the fuel cell;

b) forming a control vector (U) on the basis of the purge signal ($Q_{ao}$) and of the measurements of the electric current (I), of the temperature (T) and of the cathodic pressure ($P^c$);

c) forming a measurement vector (Y) on the basis of an ohmic resistance value (Rm) of the membrane deduced from the measurements of the electric current (I) and of the voltage (V), and on the basis of the measurement of the anodic pressure ($P^a$);

d) calculating a non-corrected temporal variation ($\dot{\hat{X}}_{nc}$), on the basis of a prior estimate ($\hat{X}$) of the state (X) and of the control vector (U), based on a predetermined representation (f) of the state of the electrochemical system, the state (X) being formed from state variables that are representative of the amounts of nitrogen ($n_{N_2}^a$) and of hydrogen ($n_{H_2}^a$) at the anode, and of the amounts of water at the anode ($n_{H_2O}^a$), at the cathode ($n_{H_2O}^c$), and in the membrane ($\lambda_m$);

e) calculating a corrective term ($\varepsilon$) in sliding mode on the basis of a difference (S) between the measurement vector (Y) and a measurement estimate ($\hat{Y}$) of the measurement vector (Y) obtained on the basis of a prior estimate ($\hat{X}$) of the state (X);

f) calculating an estimate ($\hat{X}$) of said state (X) of the electrochemical system for the measurement time ($t_k$), on the basis of the non-corrected temporal variation ($\dot{\hat{X}}_{nc}$) and of the corrective term ($\varepsilon$);

g) reiterating steps a) to f) while incrementing the measurement time, the prior estimate ($\hat{X}$) of steps d) and e) then corresponding to the state estimate ($\hat{X}$) calculated in the preceding iteration.

2. The method according to claim 1, wherein the difference (S) is equal to the difference between the measurement vector (Y) and the measurement estimate ($\hat{Y}$).

3. The method according to claim 1, wherein the measurement estimate ($\hat{Y}$) is calculated on the basis of the state estimate ($\hat{X}$) calculated at the preceding measurement time ($t_{k-1}$), based on a predetermined model (h) expressing a relationship between the measurement vector (Y), the state (X) and the control vector (U).

4. The method according to claim 1, wherein the corrective term ($\varepsilon$) is equal to the product of a predetermined gain parameter (K) and a sign function applied to the difference (S).

5. The method according to claim 1, wherein the state vector (X) is defined such that $X=[n_{N_2}^a; n_{H_2O}^a; n_{H_2O}^c; \lambda_m; n_{H_2}^a]$, the control vector (U) is defined such that $U=[Q_{ao}; I; T; P^c]$, and the measurement vector (Y) is defined such that $Y=[R_m; P^a]$.

6. The method according to claim 1, wherein step f) of calculating the state estimate ($\hat{X}$) comprises a step of calculating a state estimate variation term ($\dot{\hat{X}}$), the terms of which are written as:

$$\begin{cases} \dot{\hat{x}}_1 = f_1(\hat{x}, u) - \sigma_1 \cdot \text{sign}(s_2) \\ \dot{\hat{x}}_2 = f_2(\hat{x}, u) - \sigma_2 \cdot \text{sign}(s_2) \\ \dot{\hat{x}}_3 = f_3(\hat{x}, u) - \sigma_3 \cdot \text{sign}(s_1) \\ \dot{\hat{x}}_4 = f_4(\hat{x}, u) - \sigma_4 \cdot \text{sign}(s_1) \\ \dot{\hat{x}}_5 = f_5(\hat{x}, u) - \sigma_5 \cdot \text{sign}(s_2) \end{cases}$$

where $f_{i=1-5}$ are the terms of said state representation (f), $\sigma_{i=1-5}$ are the terms of a gain parameter (K), and $s_{i-1,2}$ are the terms of said difference (S), which are defined by $s_1 = y_1 - \hat{y}_1$ and $s_2 = y_2 - \hat{y}_2$, where $y_1$ and $y_2$ are the terms of the measurement vector (Y), and where $\hat{y}_1$ and $\hat{y}_2$ are the terms of the measurement estimate ($\hat{Y}$).

7. The method according to claim 6, wherein the gain parameter (K) is determined so as to verify the functions $\dot{V}_1 = s_1 \dot{s}_1 < 0$ and $\dot{V}_2 = s_2 \dot{s}_2 < 0$.

8. A device for observing a state (X) of an electrochemical system comprising a fuel cell that is formed from at least one electrochemical cell comprising an anode and a cathode separated from each other by a membrane, further comprising an anodic distribution circuit for distributing hydrogen that is linked to an anodic fluid discharge line ($Le^a$) that is provided with a purge valve controlled on the basis of a purge signal ($Q_{ao}$), and a cathodic distribution circuit for distributing oxygen, the observation device comprising:

sensors that are suitable for delivering, for successive measurement times ($t_k$), measurements of an electric current (I) of the fuel cell, a voltage (V) of the fuel cell, an anodic pressure ($P^a$) of the anodic distribution circuit, a cathodic pressure ($P^c$) of the cathodic distribution circuit, and a temperature (T) of the fuel cell;

a computer that is configured to implement the observation method according to claim 1, at each measurement time ($t_k$).

* * * * *